United States Patent
He et al.

(10) Patent No.: US 9,459,313 B2
(45) Date of Patent: Oct. 4, 2016

(54) TESTING APPARATUS FOR EXPANSION CARD

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Guang-Wen He, Wuhan (CN); Fu-Qiang Jing, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 101 days.

(21) Appl. No.: 14/444,067

(22) Filed: Jul. 28, 2014

(65) Prior Publication Data
US 2015/0028910 A1 Jan. 29, 2015

(30) Foreign Application Priority Data
Jul. 29, 2013 (CN) .................. 2013 1 03219745

(51) Int. Cl.
*G01R 31/00* (2006.01)
*G01R 31/28* (2006.01)

(52) U.S. Cl.
CPC ....... *G01R 31/2808* (2013.01); *G01R 31/2887* (2013.01)

(58) Field of Classification Search
CPC ...... G01R 1/02; G01R 31/2808; G06F 1/184
See application file for complete search history.

(56) References Cited

U.S. PATENT DOCUMENTS

| | | | |
|---|---|---|---|
| 6,414,505 B1 * | 7/2002 | Stauffer | G06F 1/184 324/756.05 |
| 7,088,119 B2 * | 8/2006 | Lee | G01R 31/2808 324/763.01 |
| 2004/0222784 A1* | 11/2004 | Ou | G01R 31/2808 324/750.19 |
| 2007/0218741 A1* | 9/2007 | Langgood | H01R 13/62988 439/328 |

* cited by examiner

*Primary Examiner* — Minh N Tang
(74) *Attorney, Agent, or Firm* — Zhigang Ma

(57) ABSTRACT

A testing apparatus includes a base mounted on a motherboard, an inserting unit mounted on the base, a movable unit secured to the inserting unit, and a driving device mounted between the movable unit and the base. The movable unit is driven to move by the driving device, thereby enabling the inserting unit to move to enable the expansion card to be inserted into the motherboard. The movable unit is driven to move by the driving device, thereby enabling the inserting unit to move to enable the expansion card to move out of the motherboard.

10 Claims, 5 Drawing Sheets

TESTING APPARATUS FOR EXPANSION CARD

FIELD

The subject matter herein generally relates to a testing apparatus for inserting and removing an expansion card.

BACKGROUND

Usually, an expansion card is tested by inserting the expansion card in a testing apparatus.

BRIEF DESCRIPTION OF THE DRAWINGS

Implementations of the present technology will now be described, by way of example only, with reference to the attached figures, wherein.

DETAILED DESCRIPTION

Figure 1:
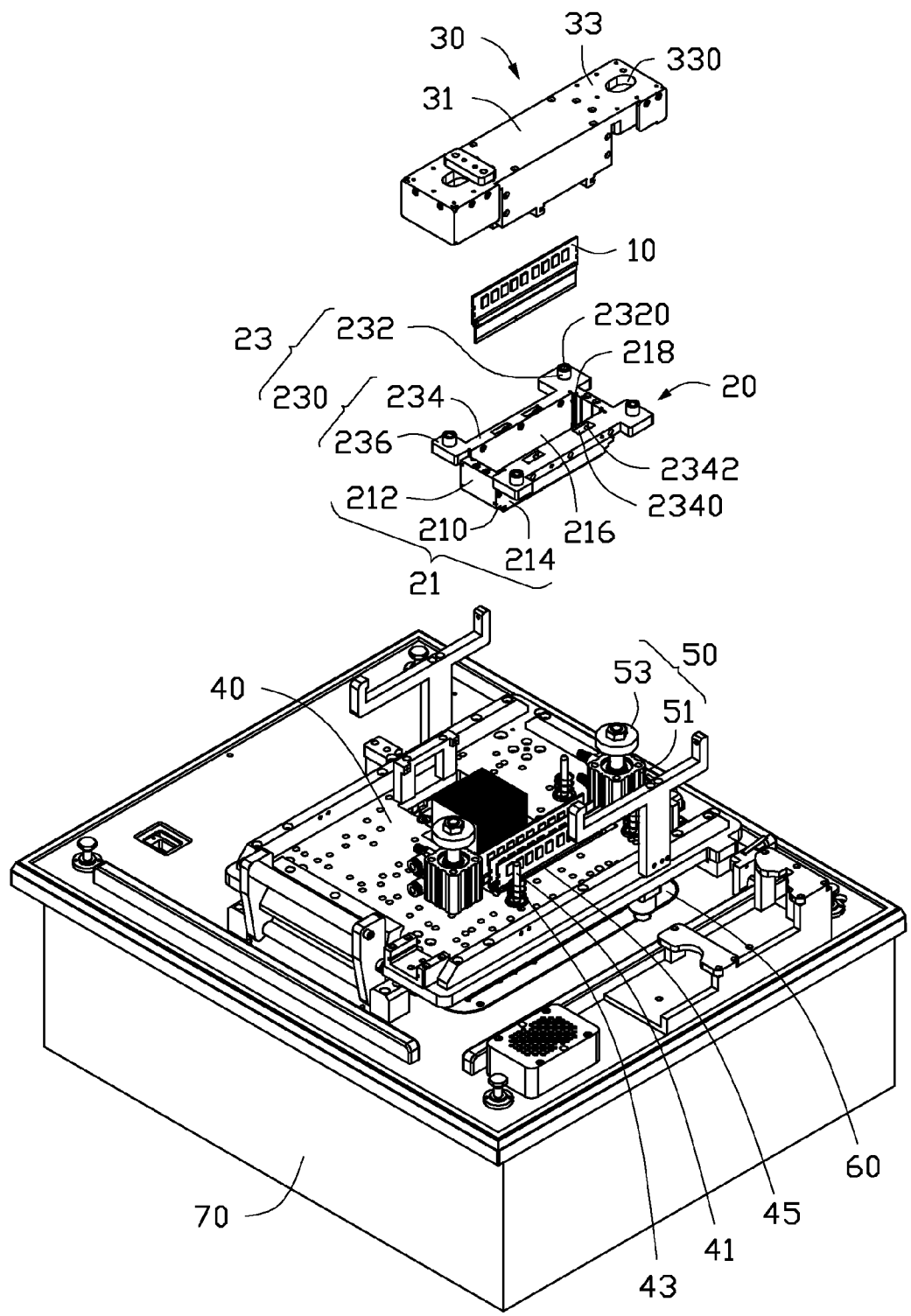
FIG. 1 is an exploded, isometric view of an embodiment of a testing apparatus for inserting and removing an expansion card.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a testing apparatus for inserting and removing an expansion card.

Figure 2:
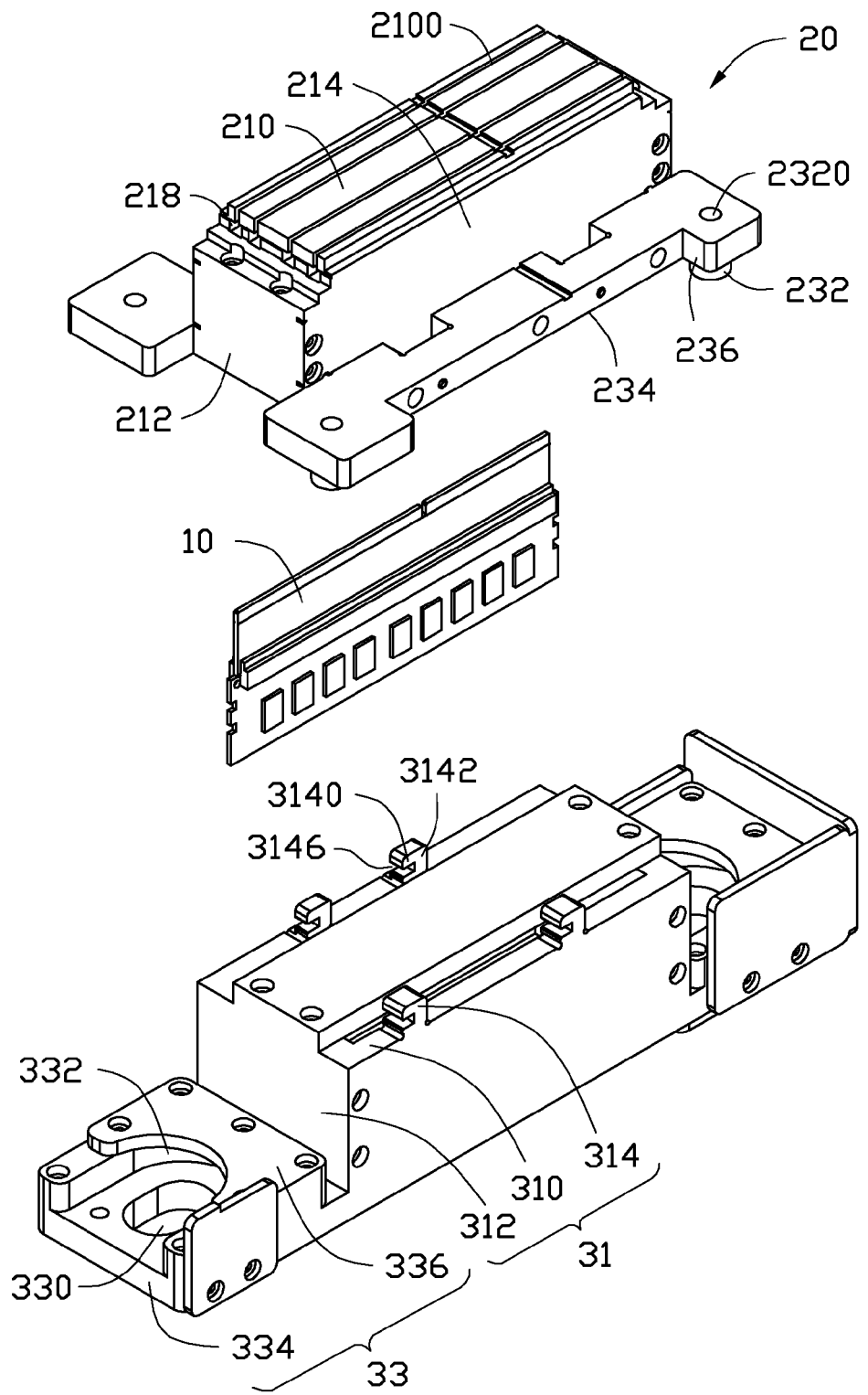
FIG. 2 is an exploded, isometric view of an inserting unit and a movable unit of FIG. 1.

FIGS. 1 and 2 illustrate an embodiment of a testing apparatus. The testing apparatus comprises an inserting unit 20 for securing four expansion cards 10, a movable unit 30, a base 40, and two driving devices 50. The driving devices 50 are mounted between the movable unit 30 and the base 40. The base 40 is mounted on an operating table 70. A motherboard 60 is mounted on the operating table 70. The four expansion cards 10 are mounted in an inserting part (not shown) of the motherboard 60.

The base 40 comprises four securing posts 41. Each securing post 41 is sleeved by an elastic member 43. The base 40 defines a mounting slot 45 and four inserting openings (not shown). The four inserting openings are for receiving the four expansion cards 10. In one embodiment, each elastic member 43 is a spring.

Each driving device 50 comprises a driving portion 51 mounted on the base 40 and a movable portion 53 connected to the driving portion 51. In one embodiment, each driving device 50 is a motor.

The inserting unit 20 comprises a main body 21 and two mounting portions 23. The main body 21 comprises an inserting portion 210, two first side portions 212 substantially perpendicularly extending from the inserting portion 210, and two second side portions 214 substantially perpendicularly extending from the inserting portion 210. The inserting portion 210 comprises five inserting bodies 2100 corresponding to the mounting slot 45. The first side portion 212 is substantially perpendicular to the second side portion 214. A receiving space 216 is defined cooperatively by the two first side portions 212 and the two second side portions 214. Sidewalls of the receiving space 216 define four inserting slots 218 for receiving the four expansion cards 10, respectively. The inserting slots 218 are defined at sides of the inserting bodies 2100. Each mounting portion 23 comprises an extending portion 230 and two mounting posts 232. The extending portion 230 comprises a connecting portion 234 substantially perpendicularly connected to the second side portion 214, and two securing blocks 236 substantially perpendicularly extending from two respective ends of the connecting portion 234. The connecting portion 234 defines two securing holes 2340. An engaging block 2342 protrudes from each securing hole 2340. The extending portion 230 can be substantially U-shaped. Each mounting post 232 substantially perpendicularly extends from the securing blocks 236. Each mounting post 232 defines a mounting hole 2320 corresponding to a securing post 41.

The movable unit 30 comprises a body 31 and two active portions 33 extending from the body 31. The body 31 comprises a bottom wall 310, four sidewalls 312 substantially perpendicularly connected to the bottom wall 310, and four engaging portions 314. The four engaging portions 314 protrude from the bottom wall 310. Each engaging portion 314 comprises two protrusions 3140, and a connecting body 3142 connected between the two protrusions 3140. Each engaging portion 314 is substantially U-shaped. An engaging opening 3146 corresponding to the engaging block 2342 is defined between the two protrusions 3140. One of the two protrusions 3140 is connected to the bottom wall 310. Each active portion 33 comprises a top portion 334 extending from the body 31, and a stopping portion 336 extending from the top portion 334. Each top portion 334 defines a through hole 330, and each stopping portion 336 defines a receiving opening 332. The receiving opening 332 communicates with the through hole 330. Each through hole 330 corresponds to a movable portion 53 of a corresponding driving device 50.

Figure 3:
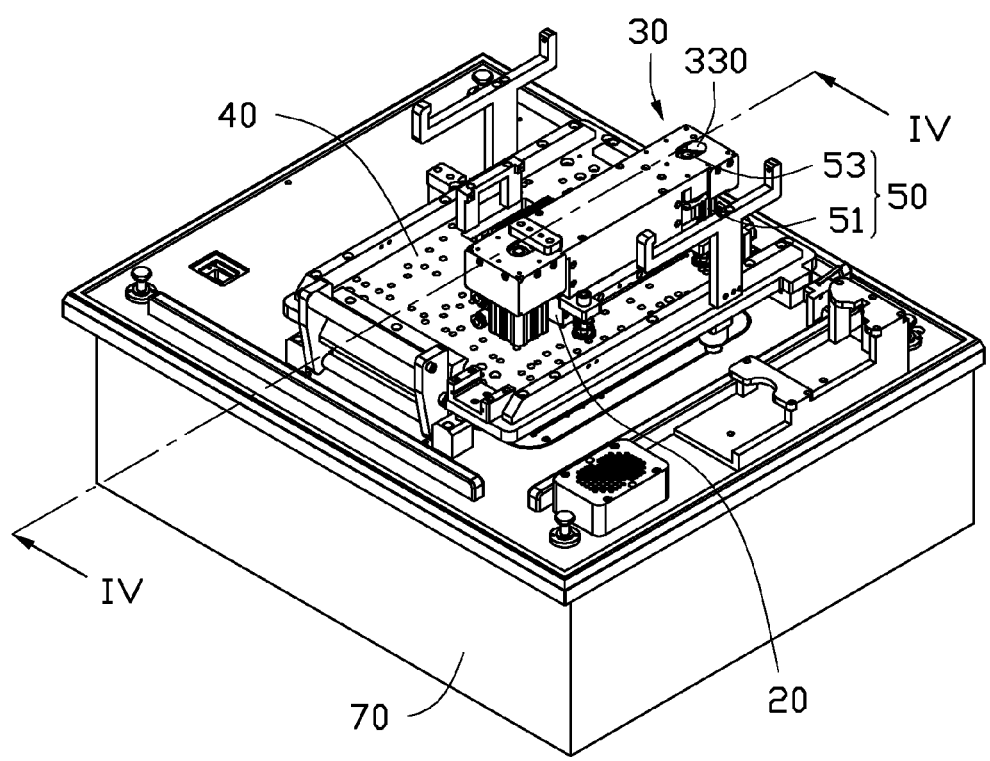
FIG. 3 is an assembled isometric view of the testing apparatus of FIG. 1.

FIG. 3 illustrates assembly of the testing apparatus. The four expansion cards 10 are received in the receiving space 216 of the inserting unit 20. Each expansion card 10 is received in a corresponding inserting slot 218. The mounting hole 2320 of the mounting post 232 is aligned with the securing post 41 of the base 40. The inserting unit 20 is moved toward the base 40 to insert each securing post 41 into a corresponding mounting hole 2320. Each elastic member 43 is resiliently compressed between the base 40 and the corresponding securing block 236. The inserting bodies 2100 are aligned with the corresponding the mounting slot 45. The inserting unit 20 is further moved toward the base 40 to insert the inserting bodies 2100 into the mounting slot 45. Thus, the inserting unit 20 is mounted on the base 40. The engaging portions 314 are aligned with the corresponding securing holes 2340. The engaging blocks 2342 are received and secured into the corresponding engaging openings 3146. Thus, the engaging portions 314 are received in the securing holes 2340. The movable portion 53 of each driving device 50 is cooperatively received in the corresponding through hole 330 and the corresponding receiving opening 332, thereby preventing the movable unit 30 from separating from the driving device 50.

Figure 4:
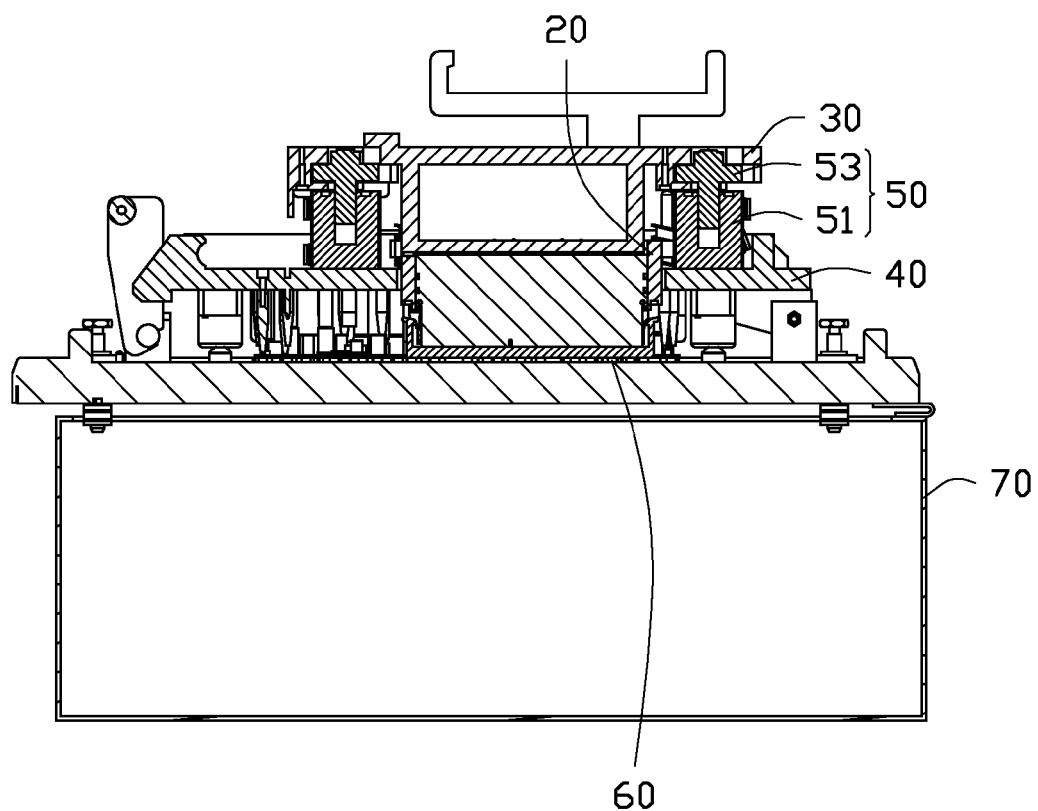
FIG. 4 is a cross-sectional view of the testing apparatus of FIG. 3, taken along line IV-IV, showing the expansion card inserted into a motherboard and the inserting unit.
Figure 5:
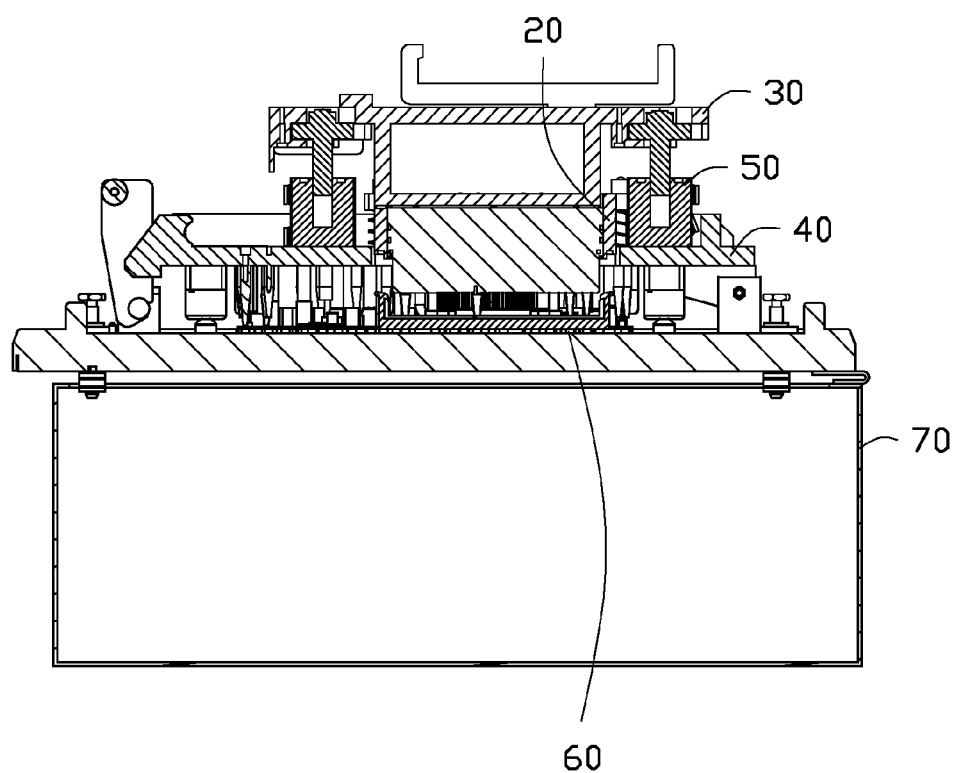
FIG. 5 is similar to FIG. 4, but shows the expansion card removed from the motherboard.

FIGS. 4-5 illustrate that when the driving device 50 is switched on, the movable portion 53 is driven to move toward the base 40 by the driving portion 51. The movable unit 30 is moved toward the base 40 by the movable portions 53, and the inserting unit 20 slides along the securing posts 41. The four expansion cards 10 are inserted into the inserting part of the motherboard 60. The movable portion 53 is driven to move by the driving portion 51. The movable unit 30 is driven to move by the movable portion 53. The inserting unit 20 slides along each securing post 41. The four expansion cards 10 disengage from the inserting part of the motherboard 60. The four expansion cards 10 disengage from the inserting openings of the base 40 and the inserting unit 20 disengages from the base 40.

In disassembly, the engaging portions 314 are removed from the securing holes 2340, thereby disengaging the movable unit 30 from the inserting unit 20. The inserting bodies 2100 are removed from the mounting slot 45, thereby disengaging the inserting unit 20 from the base 40. The four expansion cards 10 can then be removed from the inserting unit 20.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A testing apparatus comprising:
a base for supporting a motherboard;
an inserting unit located on the base and is moveable toward the base to engage an expansion card with a slot of the motherboard or is moveable away from the base to disengage the expansion card from the slot of the motherboard;
a movable unit located on the base; and
a driving device located between the movable unit and the base,
wherein the movable unit is driven by the driving device to move the inserting unit; the movable unit comprises an engaging portion; the inserting unit comprises a main body and a mounting portion connected to the main body; the main body is mounted on the base; the mounting portion comprises an engaging block; and the engaging block secures to the engaging portion.

2. The testing apparatus of claim 1, wherein the mounting portion defines a securing hole; the engaging block protrudes in the securing hole; the engaging portion is received in the securing hole; and the engaging portion defines an engaging opening; and the engaging block is engaged in the engaging opening.

3. The testing apparatus of claim 2, wherein the engaging portion comprises two protrusions and a connecting body connected to the two protrusions; and the engaging opening is surrounded by the two protrusions and the connecting body.

4. The testing apparatus of claim 1, wherein the engaging portion is substantially U-shaped.

5. The testing apparatus of claim 1, wherein the main body comprises an inserting portion, two first side portions perpendicularly extending from the inserting portion, and two second side portions perpendicularly extending from the inserting portion; and a receiving space for receiving the expansion card is defined cooperatively by the two first side portions and the two second side portions.

6. The testing apparatus of claim 5, wherein the mounting portion comprises an extending portion connected to one of the second side portions and a mounting post extending from the extending portion; the mounting post defines a mounting hole; the engaging block protrudes from the extending portion; the base comprises a securing post; and the securing post is mounted in the mounting hole, so the inserting unit secures to the base.

7. The testing apparatus of claim 6, wherein the extending portion comprises a connecting portion perpendicularly connected to the corresponding second side portion and a securing portion extending from the two ends of the connecting portion; the engaging block protrudes from the connecting portion; and the mounting portion extends from the securing portion.

8. The testing apparatus of claim 6, wherein the extending portion is substantially U-shaped.

9. The testing apparatus of claim 6, wherein the securing post receives an elastic member; and the elastic member is mounted between the mounting post and the base.

10. A testing apparatus comprising:
a base for supporting a motherboard;
an inserting unit located on the base and is moveable toward the base to engage an expansion card with a slot of the motherboard or is moveable away from the base to disengage the expansion card from the slot of the motherboard;
a movable unit located on the base; and
a driving device located between the movable unit and the base,
wherein the movable unit is driven by the driving device to move the inserting unit; the movable unit comprises an engaging portion; the inserting unit comprises a main body and a mounting portion connected to the main body; the main body is mounted on the base; the mounting portion comprises an engaging block; the engaging block secures to the engaging portion; the driving device comprises a driving portion mounted on the base and a movable portion connected to the driving portion; the movable unit further comprises a stopping portion; the movable unit defines a through hole and a receiving opening communicating with the through hole; and the movable unit is configured to move to pass through the through hole and move to receive in the receiving opening, so the movable unit moves.

* * * * *